US006665339B1

(12) United States Patent
Adams et al.

(10) Patent No.: US 6,665,339 B1
(45) Date of Patent: Dec. 16, 2003

(54) METHOD AND APPARATUS FOR REDUCING OSCILLATOR PULL IN A CMOS WIRELESS TRANSCEIVER INTEGRATED CIRCUIT

(75) Inventors: Andrew Adams, Stanmore (AU); Neil Weste, Castle Hill (AU)

(73) Assignee: Cisco Systems Wireless Networking (Australia) Pty. Limited, North Sydney (AU)

( * ) Notice: Subject to any disclaimer, the term of this patent is extended or adjusted under 35 U.S.C. 154(b) by 59 days.

(21) Appl. No.: 09/877,398

(22) Filed: Jun. 8, 2001

Related U.S. Application Data

(60) Provisional application No. 60/285,775, filed on Apr. 23, 2001, provisional application No. 60/283,609, filed on Apr. 13, 2001, and provisional application No. 60/277,370, filed on Mar. 19, 2001.

(51) Int. Cl.[7] .................................................. H03K 9/08

(52) U.S. Cl. ........................ 375/238; 379/401; 379/402; 379/403

(58) Field of Search ................................ 332/108, 109, 332/112, 110, 111, 119, 120; 379/401, 402, 403; 375/238, 100; 257/7; 455/522, 255; 331/37

(56) References Cited

U.S. PATENT DOCUMENTS

| 4,156,571 A | * | 5/1979 | Ljung ........................... 356/445 |
| 4,742,316 A | * | 5/1988 | Riedger ........................... 332/9 |
| 5,748,891 A | * | 5/1998 | Fleming et al. ............. 375/150 |

(List continued on next page.)

FOREIGN PATENT DOCUMENTS

JP         405343964 A   * 12/1993

OTHER PUBLICATIONS

"R–RF5 5GHz Radio Transceiver—R–RF5 Features", Brochure, Issued Sep. 15, 2000, Radiata, Inc. San Jose, CA.
R–M11a Single Chip Wireless LAN Modem, Brochure, Issued Sep. 15, 2000, Radiata, Inc., San Jose, CA.
P. M. Stroet, R. Mohindra, S. Hahn, A. Schuur, E. Riou, "A Zero–IF Single–Chip Transceiver for up to 22Mb/s QPSK 802.11b Wireless LAN," Paper 13.5, Proc. 2001 IEEE International Solid–State Circuits Conference, Feb. 2001, San Francisco.
"Philips Semiconductors raises the bar for integration with a new high–speed wireless networking chip—Single–chip Zero–IF radio IC cuts bill of materials cost by more than 50 percent", Philips Semiconductors, Press Release, Feb. 2, 2001.
"Radiata First to Deliver High–Performance, Low–Cost Wireless Networking Solution—Industry's First IEEE–802.11a Chipset Delivers Five Times the Performance of Current Wireless Networking Solutions at Comparable Cost", Press Release, Issued Sep. 15, 2000, Radiata, Inc. San Jose, CA.

(List continued on next page.)

Primary Examiner—Wael Fahmy
Assistant Examiner—Nathan W. Ha
(74) Attorney, Agent, or Firm—Doy Rosenfeld; Inventek

(57) ABSTRACT

A monolithic transceiver integrated circuit that includes a substrate, a transmitter subsystem of one or more subcircuits on the substrate, and a receiver subsystem of one or more, subcircuits on the substrate. Also included is a bias current supply coupled to the receiver and transmitter subsystems to provide bias current. The bias current supply includes a first bias circuit on the substrate coupled to, and to supply bias current to, a first subcircuit of the transmitter subsystem. The first bias circuit includes a first current modulator having a first switch input to indicate that the bias current is to start or stop being supplied to the first subcircuit. The first current modulator is to control the rate of change of supplied bias current in response to the first switch input. The first subcircuit may be a power amplifier. The control of the rate of change reduces oscillator pull in at least one oscillator included in the integrated circuit.

33 Claims, 7 Drawing Sheets

U.S. PATENT DOCUMENTS

| | | | | |
|---|---|---|---|---|
| 5,801,581 A | * | 9/1998 | Koizumi | 327/538 |
| 6,069,532 A | | 5/2000 | Shulman | 330/253 |
| 6,072,306 A | | 6/2000 | Dondale | 323/312 |
| 6,160,855 A | * | 12/2000 | Nakamura et al. | 375/280 |
| 6,195,429 B1 | * | 2/2001 | Emericks et al. | 379/400 |
| 6,337,647 B1 | * | 1/2002 | Masson et al. | 341/150 |
| 6,342,822 B1 | * | 1/2002 | So | 332/109 |
| 6,344,663 B1 | * | 2/2002 | Slater, Jr. et al. | |
| 6,404,223 B1 | * | 6/2002 | Degerstrom et al. | 326/30 |
| 6,404,293 B1 | * | 6/2002 | Darabi et al. | 331/37 |
| 6,417,792 B1 | * | 7/2002 | King et al. | 341/143 |
| 6,429,495 B2 | * | 8/2002 | Ooshi et al. | 257/393 |
| 6,466,173 B1 | * | 10/2002 | Li | 343/702 |
| 6,492,192 B1 | * | 12/2002 | O'Toole et al. | 438/57 |
| 6,539,235 B1 | * | 3/2003 | Schwent et al. | 455/522 |
| 2003/0060176 A1 | * | 3/2003 | Heinonen et al. | 455/255 |

OTHER PUBLICATIONS

"Radiata Technology Enables Chip–Level 'Wireless Engine'", Brochure, Issued Sep. 15, 2000, Radiata, Inc. San Jose, CA.

* cited by examiner

METHOD AND APPARATUS FOR REDUCING OSCILLATOR PULL IN A CMOS WIRELESS TRANSCEIVER INTEGRATED CIRCUIT

RELATED PATENT APPLICATIONS

This invention claims priority of the following U.S. provisional patent applications:

Ser. No. 60/277,370 entitled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH, filed: Mar. 19, 2001, (the "First Parent Application").

Ser. No. 60/283,609 entitled WIRELESS COMMUNICATION SYSTEM, filed: Apr. 13, 2001, (the "Second Parent Application").

Ser. No. 60/285,775 entitled METHOD AND APPARATUS FOR REDUCING OSCILLATOR PULL IN A CMOS WIRELESS TRANSCEIVER INTEGRATED CIRCUIT, filed: Apr. 23, 2001, (the "Third Parent Application").

The First Parent Application, the Second Parent Application, and the Third Parent Application are incorporated herein by reference.

BACKGROUND

This invention is related to integrated circuit technology, and in particular to reducing the effects of sudden surges in current demand in complementary metal oxide semiconductor (CMOS) integrated circuits for radio applications in order to reduce oscillator pull.

Integrated circuits devices are omnipresent nowadays and used for both analog and digital functions, often on the same device. CMOS technology is well established and offers many advantages over other technologies.

The use of CMOS in high frequency radio circuits has been limited for many reasons. One reason is the difficulty in realizing accurate on-chip oscillators with CMOS technology. A particular problem is the effect on oscillators of sudden power demands.

Consider, for example, a radio transceiver chip that includes a first set of analog subcircuits forming a superheterodyne receiver and a second set of analog subcircuits forming a transmitter. The transmitter further includes a superheterodyne transmitter front-end and a power amplifier. The receiver and transmitter front-end each include two mixers (not shown) requiring two oscillator signals supplied by on-chip oscillators—e.g., phase-locked loop synthesizers. The radio transceiver chip also has a power supply, including a bias current supply for the analog subcircuits. Note that providing a bias current to a circuit is also called biasing herein.

Suppose that the transceiver chip operates either in transmit mode or in receive mode in mutually exclusive transmit and receive periods. The transceiver, for example, may be a half-duplex transceiver. Alternatively, the transceiver may be a full-duplex transceiver for operation in a time-domain multiple access (TDMA) system in which transmitting and receiving occur in mutually exclusive timeslots.

Mainly in order to limit the power consumption, the power amplifier, possibly together with the transmitter frontend, is turned on for transmit periods, and off for receive periods. The transition from turned-off to turned-on causes a large rise in current demand from the power supply, which in turn causes a voltage drop across the oscillators 111 and 113. This voltage drop may cause the frequency of the oscillators to change. The amount of frequency change depends on the design of the oscillator.

Note that another reason for the power amplifier being turned off during receive to eliminate the radiation of spurious signals onto the medium which might otherwise cause regulatory compliance problems.

Furthermore, because of the large rate of change in bias currents, a relatively large (Ldi/dt) voltage drop occurs across intrinsic ground inductances. An Ldi/dt drop also occurs across intrinsic package power supply inductances. The voltage drops effectively inject noise into the substrate that perturbs the voltage across the oscillators. This also may cause changes in the oscillators' frequency. The perturbation of the oscillator frequency because of sudden changes in current is referred to as oscillator pull herein. Frequency perturbations require time to settle, and this may effect the turnaround time from transmit to receive and vice-versa. For example, in the IEEE 802.11a standard for wireless local area networks (WLANs) in the 5 GHz region, the turnaround time is specified to be within approximately 1–2 $\mu$s. Furthermore, high turnaround times in general reduce system data throughput. It is thus desirable to minimize turnaround times. This is particularly important in high data rate systems For more information on the IEEE 802.11a standard, see: (1) Draft Supplement to Standard For Telecommunications and Information Exchange Between Systems—LAN/MAN Specific Requirements—Part 11: Wireless Medium Access Control (MAC) and physical layer (PHY) specifications: High Speed Physical Layer in the 5 GHz band. {P802.11a/D7.0 July 1999}; (2) Draft Standard for Information technology—Telecommunications and information exchange between systems—Local and metropolitan area networks—Specific requirements—Part 11: Wireless LAN Medium Access Control (MAC) and Physical Layer (PHY) specifications. {ANSI/IEEE Std 802.11, 1999}; and (3) http://www.manta.ieee.org/groups/802/11/.

Similarly, turning off the bias current to the power amplifier may cause fluctuations in the local oscillator frequencies that may limit the turnaround time from transmit to receive mode. In addition, to further save power, it may be that the bias current to the receiver is also turned off during transmit periods. In such a case, the turning on or off of the bias current to the receiver may cause fluctuations in the local oscillator frequencies that may limit the turnaround time from transmit to receive mode or vice-versa.

In prior art systems, the effect of oscillator pull was reduced by locating oscillators and power amplifier or other high current subcircuits on different substrates, and/or by shielding the oscillators using, for example, metal casings. It is desirable to reduce oscillator pull and thus reduce the turnaround time while including the oscillators on the same substrate as other subcircuits. Furthermore, it is desirable to avoid relatively expensive shielding.

SUMMARY

One embodiment described herein is a monolithic integrated circuit that includes a substrate, a first set of one or more subcircuits on the substrate, and a second set of one or more subcircuits on the substrate. Also included is a bias current supply coupled to the first and second sets to provide bias current to the first and second sets. The bias supply includes a first bias circuit on the substrate coupled to, and to supply bias current to, a first subcircuit of the first set. The first bias circuit includes a first current modulator having a first switch input to indicate that the bias current is to start being or stop being supplied to the first subcircuit. The first current modulator is to control the rate of change of supplied bias current in response to the first switch input.

In one embodiment, the first and second sets comprise MOS transistors. In one version, the MOS transistors are in a CMOS configuration.

In one embodiment, the integrated circuit operates as a radio transceiver including a receiver and a transmitter. The transmitter includes the first set of subcircuits and the receiver includes the second set of subcircuits, The first subcircuit includes a power amplifier in the transmitter. The radio transceiver may operate in a mode having mutually exclusive transmit and receive time periods, with the first switch input to turn the power amplifier on or off for respectively operating or not operating in a transmit period.

In one embodiment, the bias current supply further includes a second bias circuit on the substrate coupled to, and to supply bias current to, a second subcircuit of the second set, and a third bias circuit on the substrate coupled to, and to supply bias current to, a third subcircuit of the first set. The third bias circuit includes a third current modulator having the first switch input to control the rate of change of supplied bias current in response to the first switch input, with the first switch input additionally indicating that the bias current is to start or stop being supplied to the third subcircuit.

In one embodiment, the second bias circuit includes a second current modulator having a second switch input to control the rate of change of supplied bias current in response to the second switch input, the second switch input to indicate that the bias current is to start or stop being supplied to the second subcircuit.

DETAILED DESCRIPTION

Figure 1:
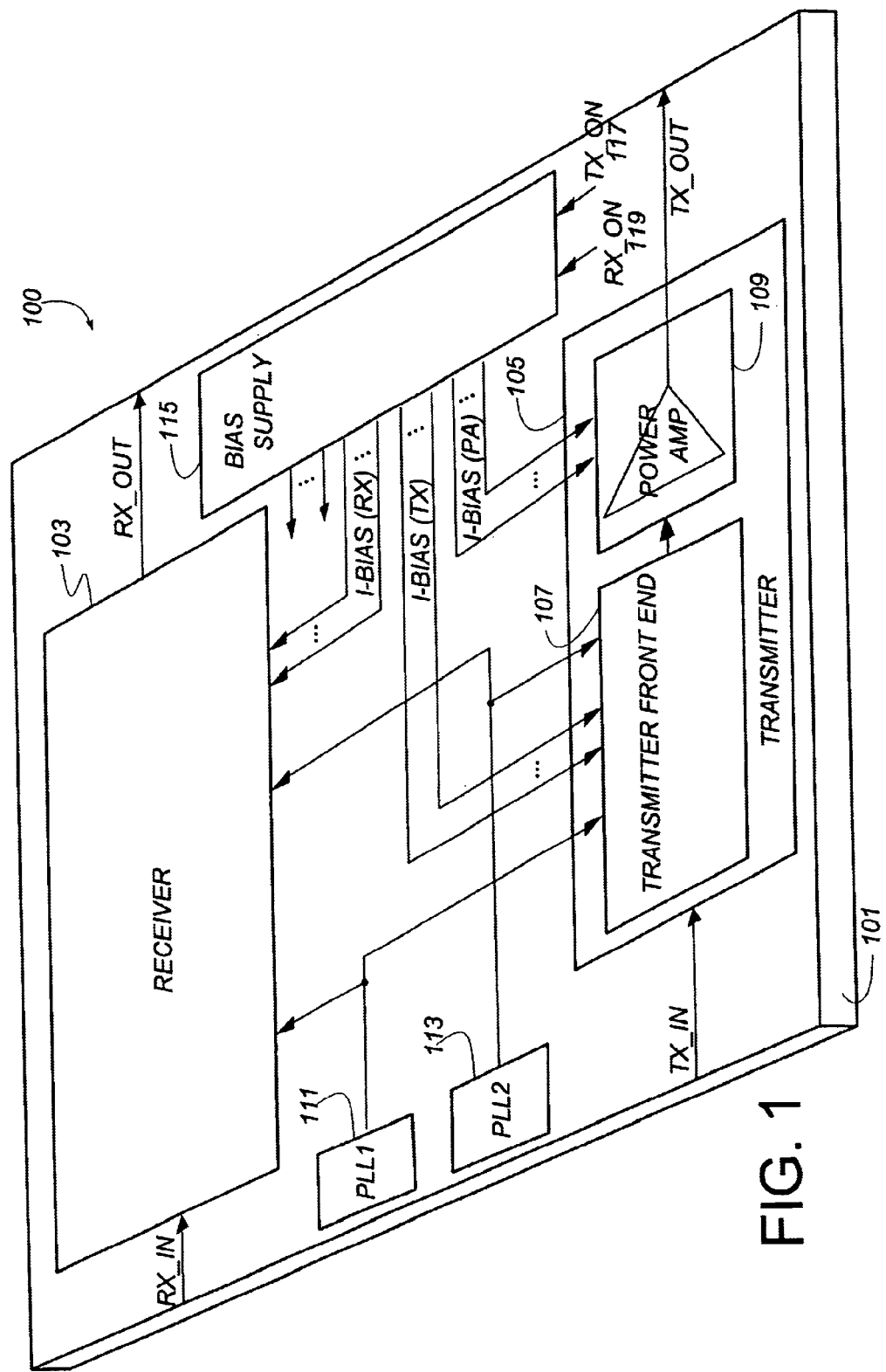
FIG. 1 shows a two-stage superheterodyne transceiver.

FIG. 1 shows in block diagram form a radio transceiver monolithic integrated circuit 100 that includes a substrate 101 and first set of analog subcircuits on the substrate forming a receiver subsystem 103 and a second set of analog subcircuits on the substrate forming a transmitter subsystem 105. The transmitter subsystem 103 further includes a transmitter frontend 107 and a power amplifier subsystem 109. The receiver subsystem 103 and transmitter front-end 107 are each in a two-stage superheterodyne configuration that includes two mixers (not shown) requiring two oscillator signals. PLL1 (111) and PLL2 (113) are on-chip oscillators—e.g., phase-locked loop synthesizers—that generate local oscillator signals for the two mixers that are included in each of receiver subsystem 103 and transmitter front-end 107. In one embodiment, each of PLL1 and PLL2 includes a voltage-controlled oscillator (VCO) and a phase error detector.

Radio transceiver 100 is substantially monolithic and in one embodiment, includes metal oxide semiconductor (MOS) circuitry, including CMOS analog and digital circuitry. In one embodiment, one or more intermediate frequency (IF) filters for the receiver subsystem 103 and for the transmitter front-end 107 are off-chip. The oscillators 111 and 113 are on-chip.

In one embodiment, radio transceiver 100 includes a power supply that has a bias current supply 115. Bias current supply 115 supplies bias current to the receiver, to the transmitter front-end 107, to the power amplifier subsystem 109, and to other subcircuits.

In one embodiment, transceiver 100 is for half-duplex operation with mutually exclusive receive and transmit periods. In one implementation, transceiver 100 is for operation in a WLAN, for example a WLAN conforming to the IEEE 802.11 medium access control (MAC) specification, and in particular, a WLAN conforming to the 802.11a WLAN specification.

A first switch input signal TX_ON 117 is provided to indicate the start and end of a transmit period. A second switch input signal RX_ON 119 is provided to indicate the start and end of a receive period. TX_ON signal 117 is used by the bias current supply 115 to switch bias current on and off to the power amplifier subsystem 109. In one embodiment, the TX_ON signal 117 is also used by the bias current supply 115 to switch bias current on and off to the transmit front end 107. In one embodiment, the RX_ON signal 117 is used by the bias current supply 115 to switch bias current on and off to the receiver subsystem 103. IN one embodiment, TX_ON signal 117 also may be used to switch bias to the complete transmit chain.

Figure 2:
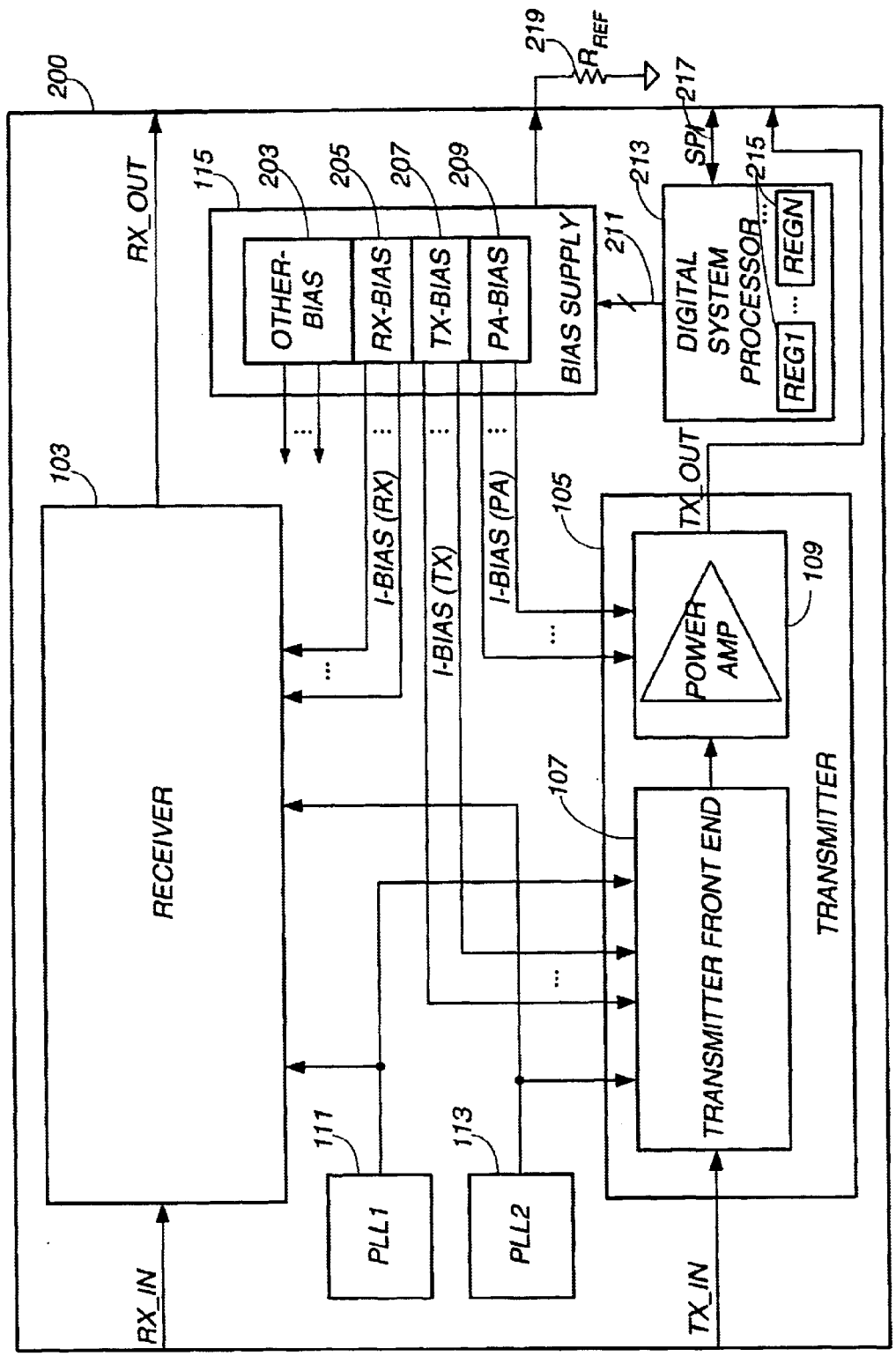
FIG. 2 shows a two-stage superheterodyne transceiver that includes a bias supply and a digital system controller in accordance with an embodiment of the invention.

FIG. 2 shows a block diagram of an embodiment 200 of the transceiver that includes a digital system processor 213 for controlling the bias supply 115. Processor 213 is a digital circuit that in one embodiment is on the same substrate as the receiver subsystem 103 and transmitter 107, and that includes one or more—say N—registers 215 and a system processor interface (SPI) 217. The SPI, also referred to as the configuration port, provides access to the registers 215, and in one embodiment, is a serial port. The digital system processor 213 provides a set of bias control signals to the bias supply, including TX_ON signal 117 and RX_ON signal 119. Current bias supply 115 includes a bias current supply 205 that supplies one or more bias lines to the receiver subsystem 103, a bias current supply 207 that supplies one or more bias lines to the transmitter front-end 107, a bias current supply 209 that supplies one or more bias lines to the power amplifier subsystem 109, and a bias current supply 203 that supplies one or more bias lines to other subcircuits. In one embodiment, the bias supply 115 includes a main bias generator that provides bias currents in units that are defined by an external reference resistor $R_{REF}$ 219. Selecting different values for $R_{REF}$ 219 provides for different power levels.

In accordance to one aspect of the invention, the power amplifier bias current supply 209 includes a first current modulator to control the rate of change of supplied bias current in response to TX_ON signal 117 such that any perturbations to the frequencies of oscillators 111 and 113 are limited.

In one embodiment, the receiver bias current supply 205 of current bias supply 115 includes a receiver current modulator to control the rate of change of supplied bias current in response to RX_ON signal 119 to further limit any perturbations to the frequencies of oscillators 111 and 113.

In one embodiment, the transmit front-end bias current supply 207 of bias current supply 115 further includes a transmitter current modulator to control the rate of change of supplied bias current also in response to TX_ON signal 117 to even further limit any perturbations to the frequencies of oscillators 111 and 113.

Figure 3A:
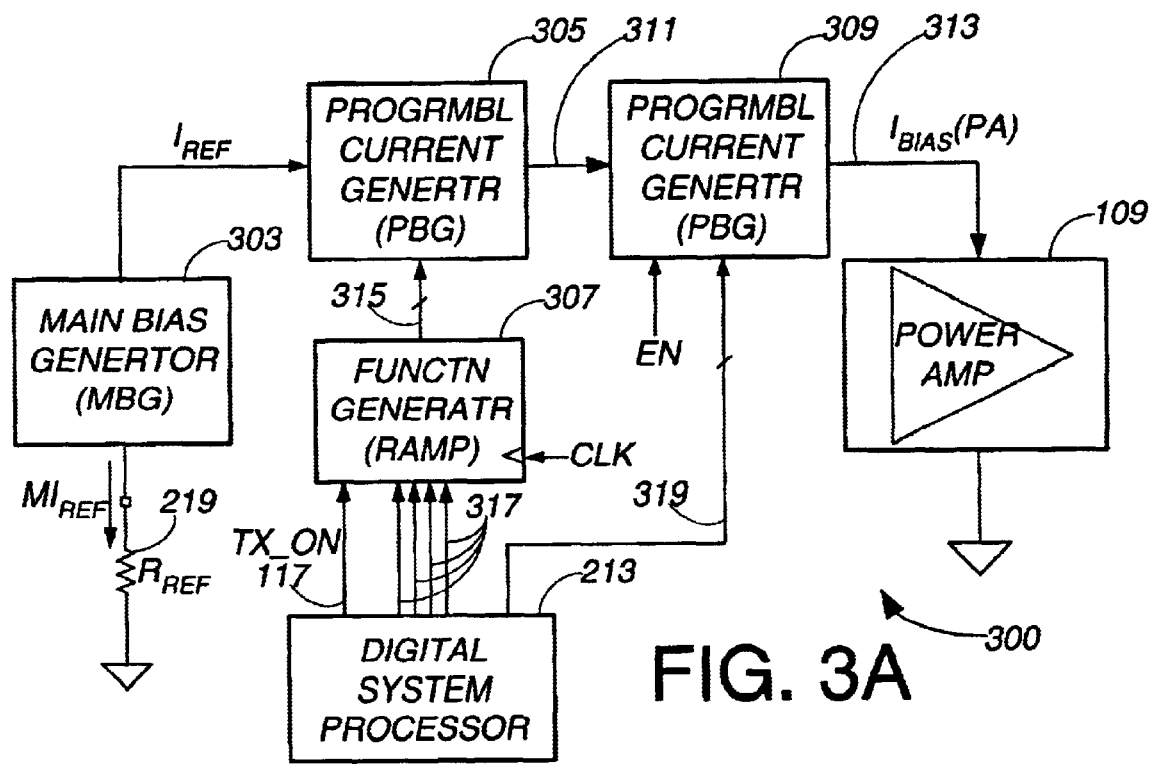
FIG. 3A shows a two-stage bias current supply that includes modulation of the bias current.

FIG. 3A shows an embodiment 300 of the power amplifier bias current supply 209. This embodiment includes a main bias generator (MBG) 303 that provides a reference current $I_{REF}$. In one embodiment, the MBG 303 includes a current generator that supplies a current (shown as $M \cdot I_{REF}$) determined by the value of the external reference resistor $R_{REF}$ 219 followed by a current dividing current mirror circuit that divides the current by an integer M into current $I_{REF}$. This current $I_{REF}$ is used by a first programmable bias current generator (PBG) 305 to generate a bias current 311 which is a multiple of the current $I_{REF}$. PBG 305 is referred to as a master PBG. In one embodiment, master PBG 305 includes a digital signal input 315 that determines the $I_{REF}$ multiple, and which is a function of time. A function generator 307 provides the time varying digital signal 315 according to the TX_ON signal 117 and a set of parameters 317. In one embodiment, master PBG 305 includes a digital to analog converter (DAC) having a current output, with the DAC having digital signal 315 as input.

In one embodiment, the modulated bias current 311 is supplied directly to the analog power amplifier subsystem 109. In another embodiment, the modulated bias current 311 is fed to another programmable bias generator 309, referred to as a slave PBG. Slave PBG 309 is controlled by a digital signal 319 from the digital system processor and sets the maximum bias current for the power amplifier subsystem. Having this maximum power setting programmable enables the transceiver 200 to operate with different power and performance levels. In one embodiment, slave PBG 309 also includes an enable (EN) input that if not set disables the current output of PBG 309.

The current modulation provided by function generator 307 is to limit the rate of change of current following the signal TX_ON indicating that the power amplifier subsystem is to be turned on or off, such that perturbations to the oscillators (PLL1 and PLL2) are limited.

In one embodiment, the modulation function provided by function generator 307 is a ramp. In the ramp embodiment, any ramp generator may be used for function generator 307, and in one embodiment, the ramp generator is a programmable digital ramp generator. In one embodiment, the digital ramp generator uses a clock signal CLK and is controlled by four parameters 317 that control turn-on delay ($N_{on}$ CLK cycles), turn-off delay ($N_{off}$ CLK cycles), current step size ($N_{istep}$ units), and time step size ($N_{tstep}$ CLK cycles). In one embodiment, $N_{on}$ and $N_{off}$ are each 8 bits, while $N_{istep}$ and $N_{tstep}$ are each 4 bits. In one embodiment, the function generator 307 produces a digital output 315 of 4 bits.

One embodiment includes a selector (not shown) coupled to and between the function generator 307 and the master PB 305. The selector has an enable input that provides a further enabling mechanism to enable/disable modulation of the bias current. The output of the function generator is coupled to the input of the selector, and the output of the selector is coupled to the input of the master bias generator 305. The enabling/disabling is under control of the digital system processor 213. When disabled, the master PBG 305 produces maximum output gated by the TX_ON signal.

Figure 4A:
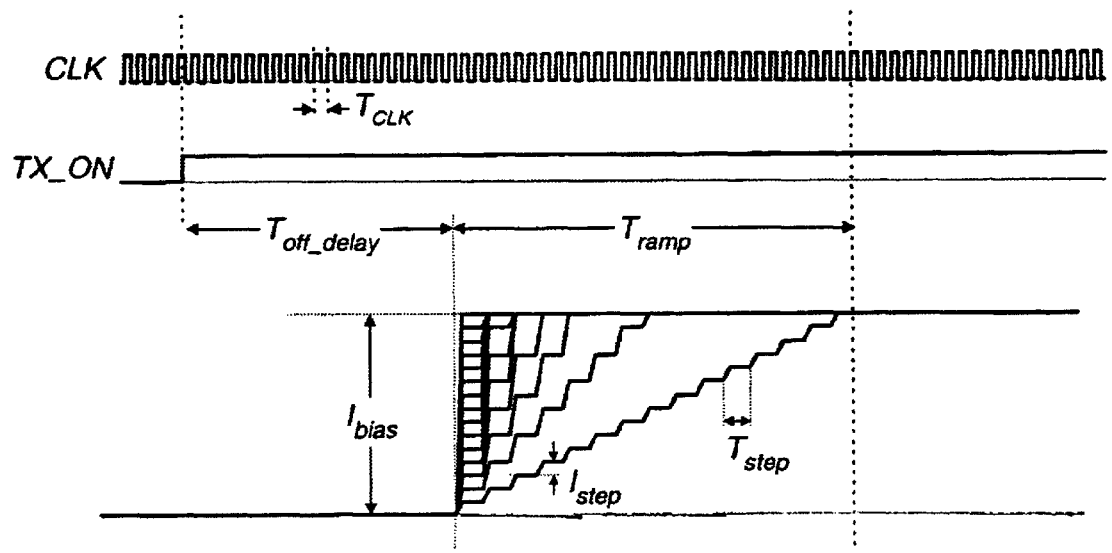
FIG. 4A shows the switch on of bias current controlled by a turn-on ramp generator according to one embodiment of the invention.

In one embodiment, the turn-on delay starts when the switch input TX_ON transitions. At the end of the turn-on delay, the ramp generator output 315, denoted $N_{bias}(t)$, where t is time, increments by $N_{istep}$ every $N_{tstep}$ clock cycles and its (4-bit) value is clamped at 15. The turn-off delay starts when the switch input TX_ON transitions from high to low. At the end of the turn-off delay, $N_{bias}(t)$, the (4-bit) ramp generator output 315, decreases from 15 by $N_{istep}$ every $N_{tstep}$ clock cycles and its value is clamped at 0. Bias current waveforms produced by these ramp generator embodiments are shown in FIG. 4A (turn-on ramp) and FIG. 4B (turnoff ramp). The output bias current as a function of time t is $$N_{bias}(t)=I_{REF} \cdot (N_{bias}(t)/15).$$

Figure 4B:
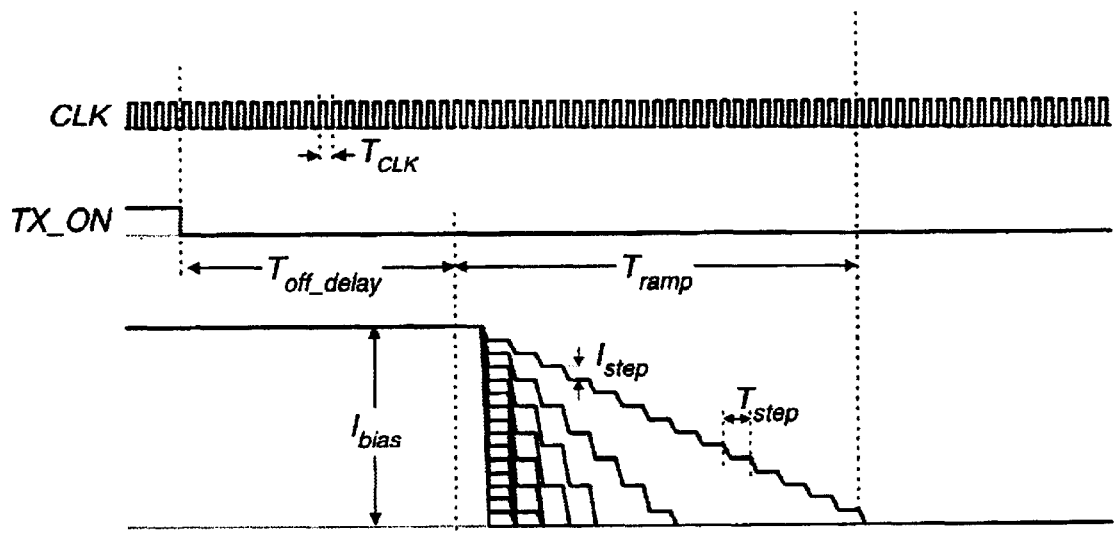
FIG. 4B shows the switch off of bias current controlled by a turn-off ramp generator according to one embodiment of the invention.

The rise and fall times of the ramps of FIGS. 4A and 4B, respectively, are $$T_{ramp}=\text{ceiling}(16/N_{istep}) \cdot N_{tstep} \cdot T_{CLK},$$

where $T_{CLK}$ is the period of clock CLK.

Figure 3B:
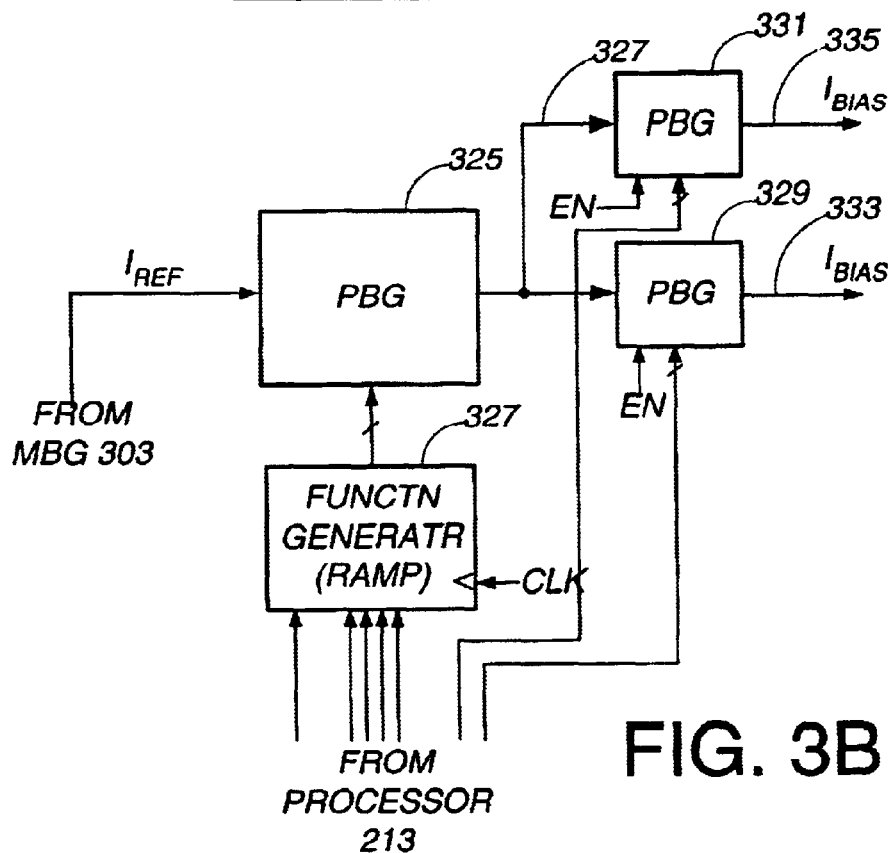
FIG. 3B shows another two-stage bias current supply that includes modulation of the bias current.

FIG. 3B shows an additional bias supply. In one embodiment in which the receiver bias current supply 205 of current bias supply 115 includes the receiver current modulator and in which the transmit front-end bias current supply 207 of current bias supply 115 includes the transmitter current modulator, each of the receiver and transmitter current modulators may have a structure similar to that shown in FIG. 3B. The current modulator shown in FIG. 3B generates two bias currents 333 and 335, each having a maximum bias current value individually set by an associated slave programmable bias generator (slave PBG 329 and slave PBG 331, respectively). Other embodiments may have any number of slave PBGs and bias current outputs, each such output to a subcircuit. The turn on and turn off of each of these are modulated using a function generator 327 that provides a modulating signal to a master programmable bias generator 325 in response to signals to turn on or off one or more subcircuits being supplied. The one master PBG drives all slave PBGs.

Figure 6:
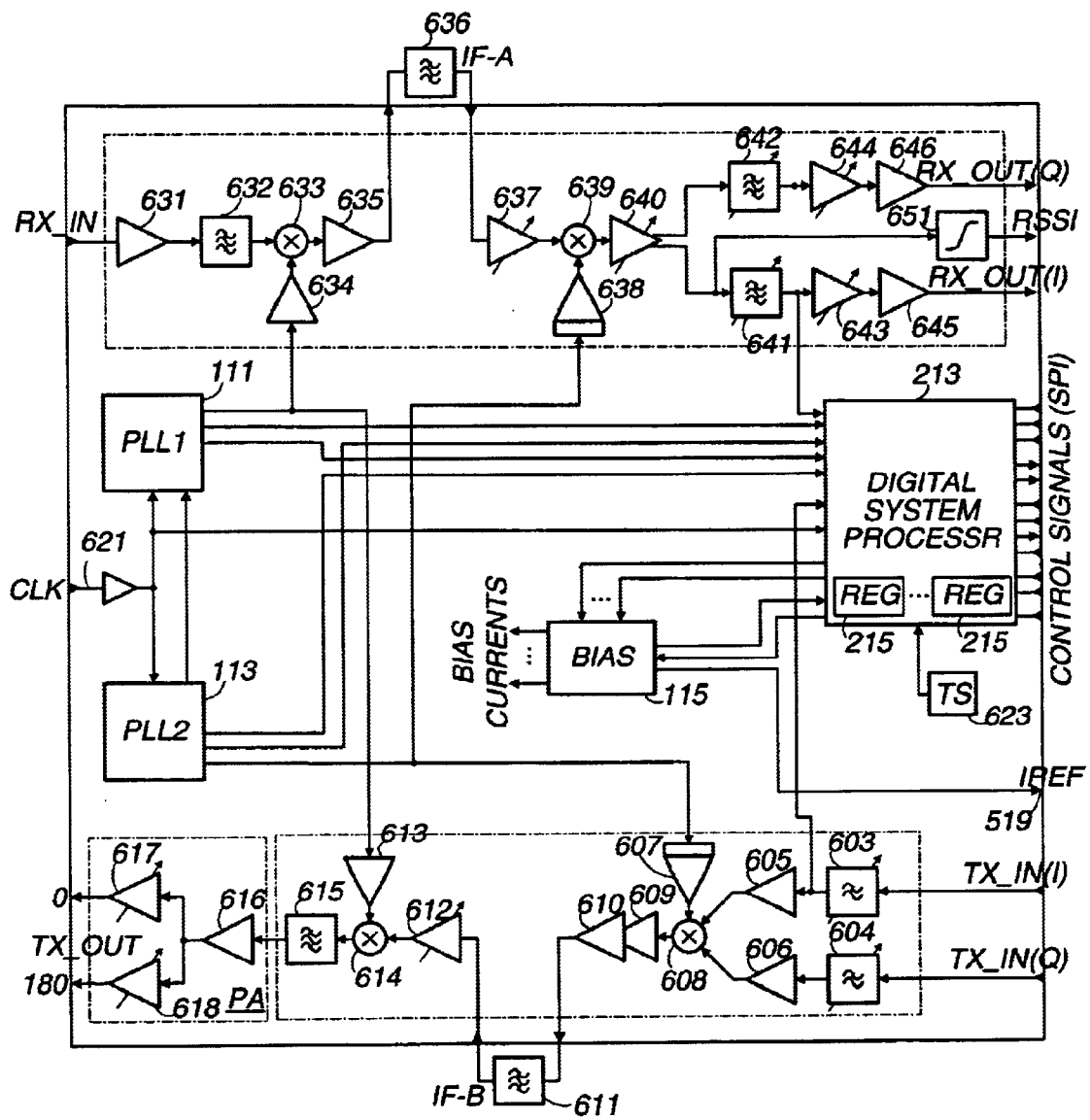
FIG. 6 shows the architecture of a transceiver integrated circuit (chip) that incorporates the programmable bias current supply of FIG. 5 according to one embodiment of the invention.

FIG. 6 shows the internal architecture of one embodiment of a monolithic transceiver integrated circuit that includes an embodiment of the inventive bias supply 115. In order not to unnecessarily obscure the present invention, various well-known structures and interfaces, secondary to the understanding of the invention, are not shown in the chip architecture of FIG. 6.

In one embodiment, the integrated circuit includes analog subcircuits that include MOS transistors. In one embodiment, the analog subcircuits are CMOS subcircuits that operate at RF frequencies in the 3 to 5 GHz range and baseband frequencies up to 40 MHz. "Baseband" refers to the low-frequency input and output frequency bands, and includes bandpass IF signals. In one embodiment, the integrated circuit also includes digital subcircuits to provide control, status, and interface logic, including digital system processor 213.

The major analog subcircuits include the transmitter front-end 107, the power amplifier subsystem 109, the receiver subsystem 103, and the phase-locked loop (PLL) based synthesizers 111 and 113 that generate the local oscillator signals for a pair of mixers included in each of the receiver subsystem 103 and the transmit front-end 107. In one embodiment, the bias current supply 115 includes both analog and digital subcircuits as shown in FIGS. 3A and 3B. One embodiment of the transceiver chip also includes an analog to digital converter (ADC) (not shown in FIG. 6) and a set of one or more digital-to-analog converters (DACs—also not shown in FIG. 6) that are used for test purposes. A temperature sensor 623 also is included.

In one embodiment, the same intermediate frequency is used in both the transmit front-end and the receiver subsystem.

In one embodiment, the digital portion of the integrated circuit includes digital system processor 213 that includes control and status registers 215, a serial configuration port (SPI 217) that provides external access to the registers and that provides for on-the-fly adjustment of such parameters as the gains of some of the transmit and receive amplifiers and adjustment of the bias current generation parameters. The digital portion of the integrated circuit may further include PLL lock-detect filters, ADC and DAC control logic, and clock generation logic.

The embodiment shown in FIG. 6 includes a transmitter front-end 107 that provides for quadrature (I and Q) input transmit signals, that, in one version, are differential signals. The receiver subsystem 103 includes quadrature (I and Q) baseband receive (output) signals, that, in one version, are differential signals. In another embodiment, the receiver subsystem 103 includes a single baseband receive signal output rather than quadrature receive signals, and such an embodiment is similar to that shown in FIG. 6, but with only the I-channel signals included in the receiver subsystem.

In one embodiment, the I- and Q-channel transmit input signals are filtered by tunable lowpass filters 603, 604. Amplifiers 605, 606 buffer the lowpass filter outputs and drive the baseband inputs of an intermediate frequency (IF) up-converter 608. The oscillator input of the up-converter 608 is driven by the output—in one embodiment, 580–880 MHz—from a quadrature oscillator-signal generator 607. The signal generator 607 generates the quadrature oscillator signal by dividing the synthesizer PLL2 (113) output—in one embodiment, 2.32–3.52 GHz—by 4. In one embodiment, the IF up-converter 608 contains a quadrature mixer and a filter to reject high-order mixer image products. The up-converter 608 drives a preamplifier 609 and an IF output buffer 610. The output buffer 610 drives an external IF filter (IF-B, 611).

The output of the external IF filter 611 feeds an IF input variable gain amplifier (VGA) 612. In one implementation, the gain of VGA 612 is adjustable using parameters entered via the SPI 217. The VGA 612 drives the IF input of an RF up-converter 614. The oscillator input of the IF up-converter 614 is driven by the output signal—in one embodiment, 4.51–4.55 GHz—of synthesizer PLL1 111 after buffering by a buffer amplifier 613. In one embodiment, the RF up-converter 614 contains a mixer and includes a filter to reject unwanted mixer image products. The up-converter 614 is followed by an RF bandpass filter 615 that further suppresses unwanted images. The output of filter 615 drives a RF power amplifier driver 616 that in turn drives the power amplifier subsystem 109. In one embodiment, two power amplifiers, 617 and 618, are included in the power amplifier subsystem 109 to produce complementary output signals in the frequency range 5.15–5.35 GHz. The two power amplifiers each have independent bias current control so that if a single-ended output only is required, one of the power amplifiers can be turned off to conserve power. In one embodiment, the gain of the power amplifiers 617, 618 is adjustable using parameters entered via the SPI 217.

One embodiment of the receiver subsystem 103 is now described in more detail. The input to the receiver subsystem drives a differential-input RF low-noise amplifier (LNA) 631. In one embodiment, LNA 631 operates over an input frequency range of 5.15–5.35 GHz. In one embodiment, bypassing the LNA 631 is possible by setting a bit entered via the SPI 217, and such bypassing reduces the receive gain. The LNA 631 is followed by an integrated image reject filter 632 that feeds the RF input of a down-converter 633. The oscillator signal from synthesizer PLL1 111 is buffered by a buffer amplifier 634 before being fed to the oscillator input of the RF down-converter 633. In one embodiment, the RF down-converter contains a relatively highly linear double-balanced mixer, a filter and an IF output preamplifier. The down-converter 633 is followed by an IF output buffer 635. The buffer 635 drives an external IF filter IF-A (636).

In one embodiment used with an intermediate frequency range of 600–900 MHz (PLL1 frequency of 4.28–4.72 GHz), for relatively high performance applications, the external IF filter 636 is a surface acoustic wave (SAW) device. In other less-demanding applications, a relatively simple LC filter may be used for IF filter 636.

The output of the external IF filter 636 feeds an IF input VGA 637, whose gain is adjustable using parameters input via the SPI 217. The IF VGA 637 feeds the IF input of a down-converter 639. The quadrature oscillator signal for the down converter 639—in one embodiment, 580–880 MHz—is generated by a quadrature signal generator 638 by dividing the synthesizer PLL2 113 output—in one embodiment, 2.32–2.52 GHz—by four. In one embodiment, the IF down-converter 639 contains a quadrature mixer that generates in-phase (I) and quadrature-phase (Q) output signals. In one embodiment, a single baseband output preamplifier is provided for the I output. In another embodiment shown in FIG. 6, a preamplifier is provided for both the I and Q outputs.

The IF down-converter I and Q outputs feed a baseband coarse-step VGA pair 640. The gains of the coarse-step VGAs are adjustable in relatively coarse steps using parameters entered via the SPI 217. The coarse-step VGAs 640 drive tunable filters 641 and 642. In a single-sideband embodiment, only the filter 641 is provided for the I output, and the filter 641 is a bandpass filter, 10–30 MHz in one embodiment. In another embodiment, tunable filters 641 and 642 are lowpass filters, 0–20 MHz in one version. Filters 641 and 642 provide further rejection of mixer image products and, in one embodiment, may be bypassed by setting a bit entered via the SPI 217.

The outputs of the filters 641, 642 drive fine-step VGAs 643 and 644, each of which in turn drives one of output buffers 645 and 646. The gains of the fine-step VGAs 643, 644 are adjustable in relatively fine steps via parameters entered via the SPI 217.

The I-channel coarse-step VGA 640 also drives a logarithmic detector/amplifier 651. The logarithmic detector allows received signal strength indication (RSSI) measurements to be made.

Note that in another embodiment of the receiver subsystem 103, a single output signal is generated from the chip rather than the I and Q outputs shown on FIG. 6. In such a single-output embodiment, I and Q outputs are internally generated and combined to give the single output. Thus only a single coarse-step VGA 640 is provided.

Figure 5:
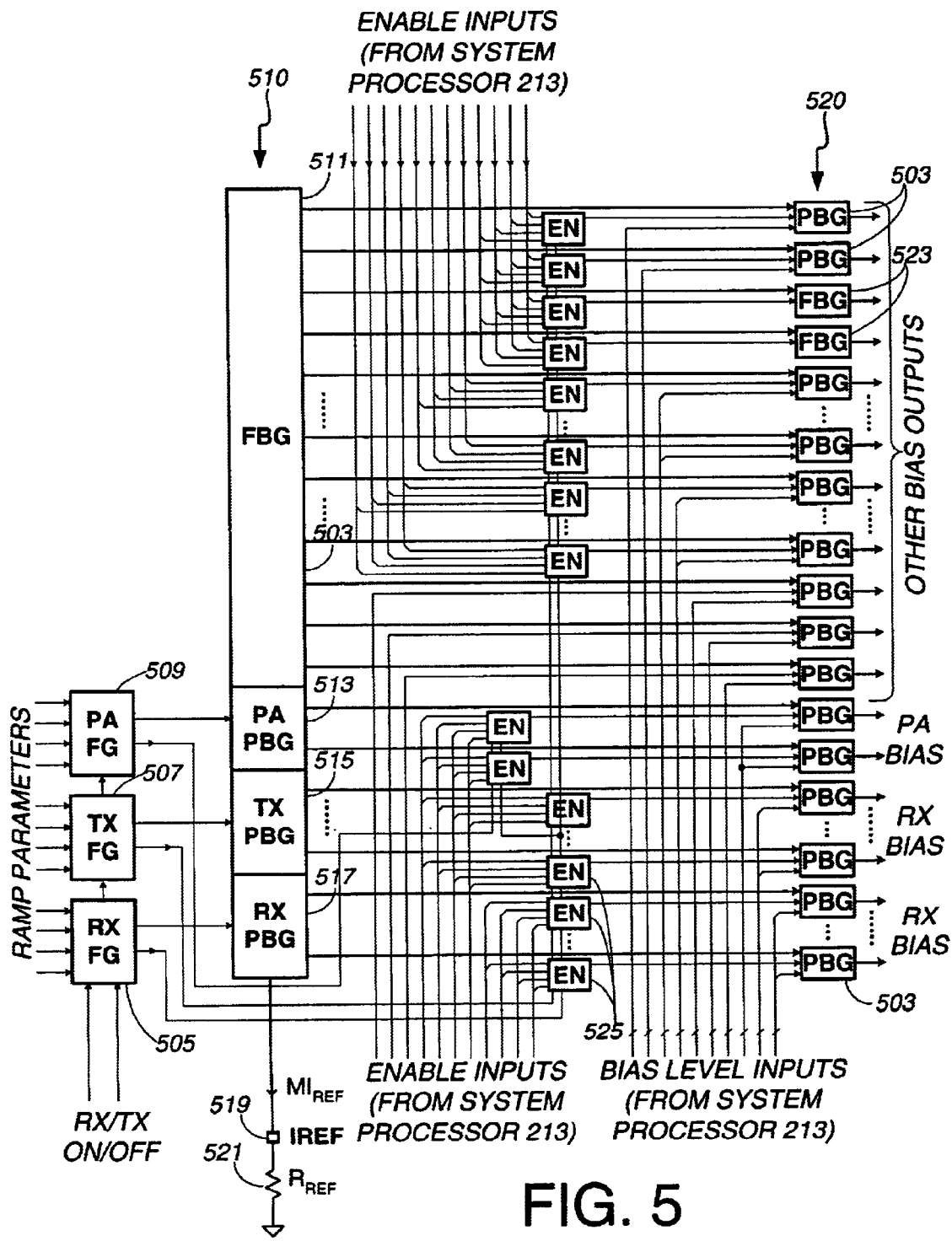
FIG. 5 shows a programmable bias current supply that includes modulation of the bias currents that are applied to sets of subcircuits according to one embodiment of the invention.

FIG. 6 includes an embodiment of the inventive bias current supply system 115 that supplies bias current to the analog circuit modules. FIG. 5 shown an embodiment of the bias current supply system 115. The maximum values of the bias currents are controlled by a set of slave programmable bias current generators (PBGs) 503 via the SPI 217. Each slave PBG 503 is similar to the slave PBG 309 of FIG. 3. Three digital programmable function generators RX-FG (505), TX-FG (507) and PA-FG (509) independently control the switch-on and switch-off bias current ramps for the receiver subcircuits, the transmitter front end subcircuits, and the transmit power amplifier subcircuits, respectively. The function generators are each similar to the function generator 307 shown in FIG. 3A. In one embodiment, each of function generators 505, 507, and 509 is a programmable digital ramp generator controlled by four ramp parameters input from the digital system processor 213. In one embodiment, each of the three function generators provides an additional digital trigger output, PA_is_on, TX_is_on, and RX_is_on, respectively, to indicate that bias current is being supplied to the power amplifier(s), transmitter front-end subcircuits, and receiver subsystem subcircuits, respectively.

In one embodiment, the bias current supply system 115 includes two sets of bias current generators. The first set, referred to as the set 510 of master bias generators includes a fixed (master) bias generator FBG 511, and three programmable master generators, PA-PBG (513), TX-PBG (515), and RX-PBG (517) for the power amplifier, transmitter front end, and receiver subsystems, respectively. Each master PBG in set 510 is controlled by the output—4-bits in one embodiment—of its respective function (e.g., ramp) generator. All the output currents of the fixed and programmable master generators are constant multiples of current $I_{REF}$, which in one embodiment is an M'th of the current sourced by an $I_{REF}$ pin 519 into off-chip resistor $R_{REF}$ (521).

Each of the second set (set 520) of current generators is referred to as a slave bias generator. In one embodiment, all the slave generators are programmable bias current generators such as slave PBG 503. In another embodiment, the second set 520 of slave generators also includes one or more fixed bias generators (FBGs) such as slave FBG 523. The outputs of these fixed and programmable slave generators supply individual analog subcircuits. For example, a set of (one or more) slave PBGs provides bias current to the subcircuits of the receiver subsystem, another set of (one or more) slave PBGs provides bias current to the subcircuits of the transmitter front-end, and yet another set of (one or more) slave PBGs provides bias current to the subcircuits of the power amplifier subsystem 109. Other FBGs or PBGs provide currents to the oscillators and other analog subcircuits. In one embodiment, each of the slave FBGs and slave PBGs has an enable input and a current input that is supplied by one of the outputs of the master bias generators. In one embodiment, the programmable slave generators have 4-bit digital control inputs from the digital system processor 213.

In one embodiment, the enable inputs of some but not necessarily all slave generators are driven by enable circuits 525. Each enable circuit 525 has four control inputs, TX_En, RX_En, MASTER_En, and DEFAULT_En, that come from registers in the digital system processor 213 referred to as bias enable registers herein, and two inputs, TX_is_on and RX_is_on, that come from the TX and RX function generators, respectively. The logic function that is performed by the enable circuits 525 is $$EN=(((TX\_is\_on.AND.TX\_En).OR.(RX\_is\_on.AND.RX\_En)).AND. MASTER\_En).OR. DEFAULT\_En$$

Setting the DEFAULT_En bit 'on' permanently enables a subcircuit being supplied by a slave bias generator, regardless of the state of the other control bits. Setting the MASTER_En bit 'off' permanently disables the subcircuit if the DEFAULT_En bit is 'on'. Setting the TX_En bit 'on' with the MASTER_En bit 'on' and the DEFAULT_En bit 'off' enables the subcircuit during transmit. Setting the RX_En bit high with the MASTER_En bit 'on' and the DEFAULT_En bit 'off' enables the subcircuit during receive.

All RX_on inputs of the enable circuits are driven by the trigger output of RX-FG 505. The TX_is_on inputs of the power amplifier enable circuits are driven from the PA_is_on trigger output of PA-FG 509. All other enable circuit TX_is_on inputs are driven from the TX_is_on trigger output of TX-FG 507.

Operation of one embodiment of the invention is now described. Referring again to FIGS. 5 and 6, one embodiment of the transceiver of FIG. 6 may be operated as a half-duplex system according to the IEEE 802.11a standard. When so operating, there may be a need to switch between transmit and receive mode relatively frequently, for example every 100 μs or so. Under the IEEE 802.11a standard, the turnaround time from transmit to receive, or vice-versa, is to be under approximately 1–2 μs.

To save power, in one embodiment, the transmitter front end and power amplifier subsystems are powered down during receive, and the receiver subsystem is powered down during transmit. Suddenly powering on or off these subsystems could cause a large rate of change of current which in turn could cause perturbation of the frequency of one or both local oscillators PLL1 and PLL2.

Figure 7A:
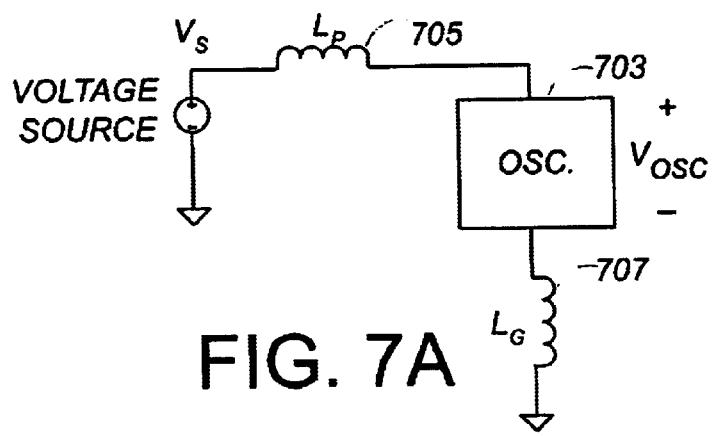
FIG. 7A shows a simplified model of the power supplied to an oscillator.

FIG. 7A shows a highly simplified model of the voltage supply across one of the phase lock loop circuits, for example, PLL 111. The model includes $L_p$, an inductance 705 representing the inductances of the power supply, and $L_G$, an inductance representing parasitic ground inductances. Voltage $V_S$ represents the ideal supply voltage that, in the steady state, is also the voltage $V_{OSC}$ across the oscillator. Suppose that that the transmitter front-end 207 and the power amplifier subsection 209 are switched on at some time $t_s$. The large rate of change of current that occurs with the sudden current demand causes voltage drops across the power supply inductances (modeled as inductance 705). Furthermore, the presence of intrinsic ground inductances (modeled as inductance 707) and the large rate of change in bias current causes noise-like voltages to be injected into the substrate. As a result, the voltage $V_{OSC}$ across the oscillator drops, for example as shown in the simplified solid curve 713 of FIG. 7B. Because the PLL cannot respond instantaneously, this voltage swing causes a change in the frequency of the oscillator, as shown—in simplified and exaggerated form—in FIG. 7C. Without further control, it may be difficult for the oscillator to get back to its specified frequency in a short time, for example within the 1–2 μs required by the IEEE 802.11a standard.

Similar perturbations occur when the transmitter front-end and power amplifier bias currents are suddenly switched off. Furthermore, similar, but perhaps smaller perturbations may occur when the receiver subsystem bias currents are suddenly switched on or off.

Reducing the magnitude of the frequency perturbation reduces the time it takes the PLL to bring the oscillator frequency back within target.

In accordance to one aspect of the invention, the power amplifier bias current supply 209 (FIG. 2) includes a first current modulator to control the rate of change of supplied bias current in response to TX_ON signal 117 such that any perturbations to the frequencies of oscillators 111 and 113 are limited. In one embodiment, the receiver bias current supply 205 of current bias supply 115 includes a second current modulator (the receiver current modulator) to control the rate of change of supplied bias current in response to RX_ON signal 119 to further limit any perturbations to the frequencies of oscillators 111 and 113. In one embodiment, the transmit front-end bias current supply 207 of current bias supply 115 includes a third current modulator (the transmitter current modulator) to control the rate of change of supplied bias current also in response to TX_ON signal 117 to even further limit any perturbations to the frequencies of oscillators 111 and 113.

Thus, a separate bias current modulator is introduced to each of one or more sets of subcircuits that has a substantial bias current demand and that is switched on or off.

Returning to FIG. 7B, curve 703 shows what the voltage perturbation across the oscillator might be when the switch on of bias current is controlled in accordance to an embodiment of the invention. FIG. 7D shows in simple form the perturbation that might occur to the frequency of a local oscillator when the turn-on of the bias current is controlled according to one embodiment of the invention.

Figure 7B:
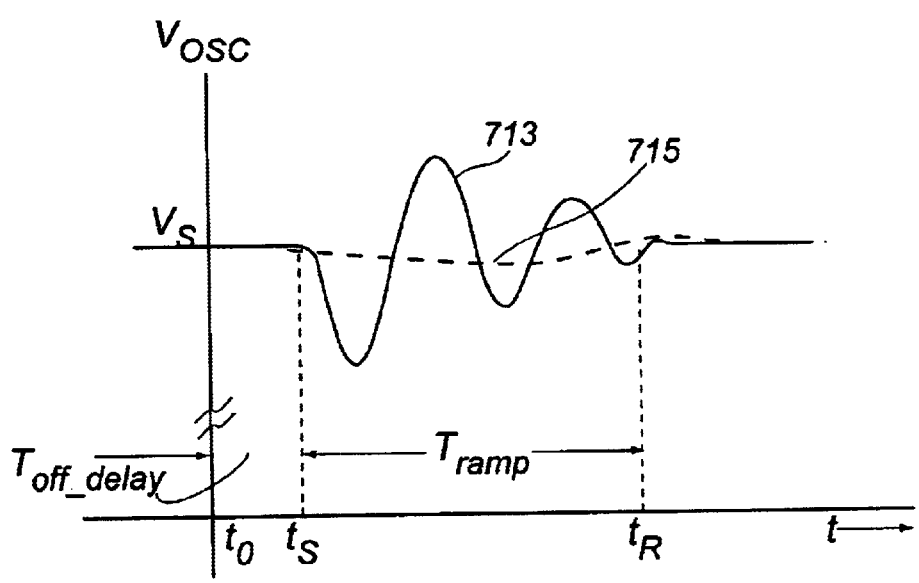
FIG. 7B shows in simple form the perturbation of the voltage across the oscillator that might occur when the bias current supply is not controlled and is controlled according to one embodiment of the invention.
Figure 7C:
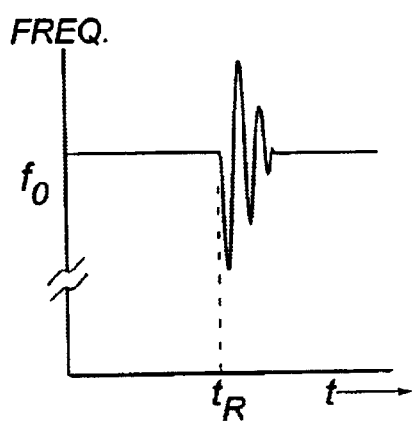
FIG. 7C shows in simple form the perturbation that might occur to the frequency of a local oscillator when the bias current supply is not controlled according to an aspect of the invention.
Figure 7D:
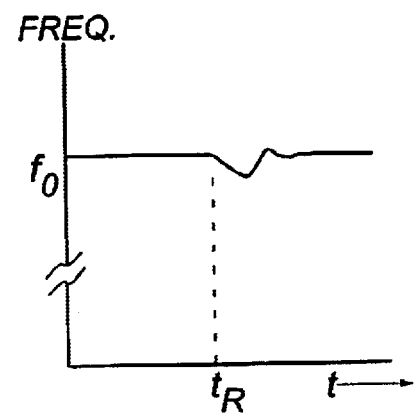
FIG. 7D shows in simple form the perturbation that might occur to the frequency of a local oscillator when the bias current supply is controlled according to one embodiment of the invention.

It should be noted that the voltage and frequency graphs of FIGS. 7B–C are shown in a very simple form for the purpose of explaining the invention. Plots of actual voltage and frequency would likely be different.

As described above, FIGS. 3 and 5 show one embodiment of the power amplifier bias supply 209, the receiver bias supply 205, and the transmit front-end bias supply 207, each including a bias current modulator in the form of a function generator driving a programmable bias current generator. FIGS. 4A and 4B show the bias current modulation produced by one embodiment of the function generators that each produce ramp functions.

In one embodiment, a delay time is introduced to the current modulation to stagger the times at which different subcircuits are switched on or off to further limit the rate of change of current. In one version, the power amplifier bias supply 209 and the transmit front-end bias current supplies start supplying bias currents to the power amplifier and the transmit-front-end, respectively, after different delay times from when TX_ON indicates to the bias supply 115 to start supplying bias current to transmitter subsystem 105. In one embodiment, when TX_ON indicates a start of a transmit period, the transmit front-end is first switched on, and then, after a delay time (pre-set via the SPI 217) to allow for settling of transients, the power amplifier is switched on with a modulation to control the rate of change. So staggering the switch-on times spreads the transient current load over time, and slows down the overall rate of change of bias current.

Note that in some applications, the staggering of the start times and/or of the switch-off times of different subcircuits may be sufficient to control the rate of change of current without the need for further modulating the bias current during switch on and/or switch off. Thus, in one embodiment, the function generators are delay elements that apply a delay to the start time and switch-off time in response to a switch input.

In one embodiment, each of the function generators is controlled by a set of parameters in one or more of registers 215. The registers are loaded via the SPI 217. In an embodiment in which the function generators are ramp generators, each ramp generator is controlled by the four parameters 317 that control turn-on delay ($N_{on}$ CLK cycles), turn-off delay ($N_{off}$ CLK cycles), current step size ($N_{istep}$ units), and time step size ($N_{tstep}$ CLK cycles).

In one embodiment, setting of the function generator parameters is carried out by performing an experiment on a sample of the chip. The settings may need to be changed if the type of packaging of the integrated circuit changes. For example, the parasitic inductances that are modeled by ground inductance $L_G$ (see FIG. 7) would change for a different size or type of package. The settings may also need to change if the type of power supply regulator used in the system that incorporates the transceiver chip changes.

For a CMOS implementation of the design shown in FIG. 6, setting the parameters once is typically sufficient. Other technologies may need finer control. For example, different foundries may produce chips that require different sets of parameters even when incorporated in identical system designs.

The setting of the parameters for incorporating the transceiver chip into a target includes placing a sample chip in a test board, connecting a power supply to the test board that has the same characteristics as the power supply of the target system, and connecting a frequency discriminator to the output of the voltage controlled oscillator (VCO) of the local oscillator (PLL1 or PLL2) to monitor the frequency of the VCO. One applies a switch input (e.g., a change of state of TX_ON) to cause the power amplifier subsystem 109 and transmitter front-end 107 to be switched on, and monitors the VCO frequency as a function of time for different values of the parameters. The experiment is repeated for the other oscillator. An optimal set of parameters is chosen that minimizes the perturbations to the VCOs of both PLL1 (111) and PLL2 (113). The optimal set of parameters are such that the RX-TX turnaround specifications, for example under IEEE 802.11a, for the device are met.

While a ramp gives reasonable results, an alternate embodiment includes a function generator that generates a function whose shape is optimally determined for minimizing the voltage fluctuations across the VCO. A model of the transceiver circuit, including a model of the power supply and a model of the parasitic inductances, capacitances and/or resistances, runs on a computer and is generated from the design files for the chip and using parameters of the process used in the chip. The model may be as detailed as required. The shape of the function that minimizes the voltage fluctuations across the VCO is determined on the computer by performing a mathematical optimization using the model and process parameters.

Note that in one embodiment shown in FIG. 3B and in FIG. 5, a single master function generator (327 in FIG. 3B, 509 in FIG. 5) controls and defines the overall shape of a set of programmable slave PBGs such as PBG 329 and PBG 331 in FIG. 3B, in an alternate embodiment, each slave programmable bias generator could have its own turn-on or turn-off shape, implemented, for example, by a non-linear DAC or and interposed lookup table. The output bias current is then modulated by the product of the master modulation of function generator 327 and the individual modulation function of the slave PBG. This provides for further optimization at the level of individual subcircuits within each set of subcircuits. For example, within the power amplifier, a first-subcircuit, e.g., a relatively low-power subcircuit would have its PBG adjusted to ramps up relatively fast and a second subcircuit, e.g., a relatively high-power subcircuit would have its PBG adjusted to ramp up relatively slowly compared to the first circuit.

The embodiments described above include open loop control of the perturbations caused by the switch-on or switch-off of bias currents. One alternate embodiment includes feedback control of the perturbations. A first feedback embodiment includes a monitor of the current fluctuations (di/dt) and may be designed, using known methods for feedback control system design, to minimize di/dt in response to a step input. A further or alternate design criterion may be minimizing the time required to turn the one or more subcircuits on or off.

A second feedback embodiment is applicable to chips that include a PLL that has a phase error detector. The phase error signal from the phase error detector of the PLL is coupled in feedback mode to a bias current controller in order to keep that phase error of the PLL within specified bounds during switch-on or switch-off of the bias current supplied by the bias supply circuit.

Thus, while some embodiments, contexts, and applications have been described herein, the invention is not limited to those embodiments, contexts, and applications.

For example, one transceiver embodiment of the invention includes only switching the power amplifier subsystem on and off. The transceiver front-end, consuming less power, is maintained on.

Furthermore, while one transceiver embodiment includes partitioning the transceiver into a transmitter front end, a receiver subsystem, and a power amplifier subsystem, and independently modulating the switch on and off to the set of subcircuits in each subsystem, different partitioning may be used, with a different number of bias current supplies whose switch on and off are independently controlled.

Another embodiment includes controlling the switch on and off of a plurality of subcircuits by staggering the switch on and switch off to spread the change of current and thus reduce the perturbations.

While one transceiver embodiment of the invention includes a superheterodyne receiver and a superheterodyne transmitter, other transceiver architectures may also benefit from the invention.

Furthermore, while, one transceiver embodiment of the inventing is for half-duplex operation, the invention is not restricted to any particular mode of operation. Other modes of operation, including, for example, TDMA half-duplex and TDMA full-duplex may benefit from the invention.

While a transceiver embodiment for operation with RF frequencies in the 5 GHz range has been described, the invention may be embodied in transceivers operating in other RF frequency ranges. Furthermore, while a transceiver embodiment for operation conforming to the IEEE 802.11a standard has been described, the invention may be embodied in transceivers conforming to other standards and for other applications, including, for example, the GSM, PHS, and other cellular wireless telephony standards.

Furthermore, while embodiments of the invention that include one or more digital function generators such as digital ramp generators have been described, the invention may also be implemented with other mechanisms for modulating bias current, for example, using analog function generators, so that a bias current generator conforming to the invention may comprise, for example, only analog subcircuits.

Furthermore, while embodiments of the invention include one or more digital function generators controlled by registers, other embodiments may include digital function generators under direct memory control.

Embodiments described herein include a main bias current generator whose current is set by an external resistor. Other embodiments may use a different main bias generator, not necessarily set by an external resistor.

Furthermore, while embodiments described herein are for an integrated circuit that includes MOS transistors, the invention is not restricted to MOS transistor circuits. Furthermore, while CMOS embodiments are described herein, the invention is not restricted to a CMOS integrated circuit.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

What is claimed is:

1. A monolithic integrated circuit comprising:
    a substrate;
    a first set of one or more subcircuits on the substrate;
    a second set of one or more subcircuits on the substrate; and
    a bias current supply coupled to the first and second sets to provide bias current to the first and second sets, and including:
        a first bias circuit on the substrate coupled to and to supply bias current to a first subcircuit of the first set, the first bias circuit including a first current modulator having a first switch input to control the rate of change of supplied bias current in response to the first switch input, the first switch input to indicate that the bias current is to start or stop being supplied to the first subcircuit,
        wherein the integrated circuit is for operation as a radio transceiver including a receiver and a transmitter,
        wherein the transmitter includes the first set of subcircuits and the receiver includes the second set of subcircuits, and
    wherein the first set of subcircuits includes a power amplifier in the transmitter.

2. An integrated circuit as described in claim 1, wherein the radio transceiver is for operation in a mode having mutually exclusive transmit and receive time periods, and wherein the first switch input is to turn the power amplifier on or off for respectively operating or not operating in a transmit period.

3. An integrated circuit as described in claim 2, wherein the bias current supply further includes:
    a second bias circuit on the substrate coupled to and to supply bias current to a second subcircuit of the second set, and
    a third bias circuit on the substrate coupled to and to supply bias current to a third subcircuit of the first set, the third bias circuit including a third current modulator having the first switch input to control the rate of change of supplied bias current in response to the first switch input, the first switch input additionally to indicate that the bias current is to start or stop being supplied to the third subcircuit.

4. An integrated circuit as described in claim 3, wherein the second bias circuit includes a second current modulator having a second switch input to control the rate of change of supplied bias current in response to the second switch input, the second switch input to indicate that the bias current is to start or stop being supplied to the second subcircuit.

5. An integrated circuit as described in claim 3, wherein the first and third bias circuits are to start supplying bias currents to the first and third subcircuits after different delay times from when the first switch input indicates to start supplying bias current to the first and third subcircuits.

6. An integrated circuit as described in claim 2, further comprising:
   a first oscillator circuit on the substrate for operation at a first frequency,
   wherein the first current modulator is to control the rate of change of supplied bias current such that perturbations of the first frequency are reduced compared to the bias current to the first subcircuit being turned on or off substantially instantaneously in response to the first switch input.

7. An integrated circuit as described in claim 6, further comprising:
   a second oscillator circuit on the substrate for operation at a second frequency,
   wherein the first current modulator is to control the rate of change of supplied bias current such that perturbations of the second frequency are reduced compared to the bias current to the first subcircuit being turned on or off substantially instantaneously in response to the first switch input.

8. A monolithic integrated circuit comprising:
   a substrate;
   a first set of one or more subcircuits on the substrate;
   a second set of one or mare subcircuits on the substrate; and
   a bias current supply coupled to the first and second sets to provide bias current to the first and second sets, and including:
      a first bias circuit on the substrate coupled to and to supply bias current to a first subcircuit of the first set, the first bias circuit including a first current modulator having a first switch input to control the rate of change of supplied bias current in response to the first switch input, the first switch input to indicate that the bras current is to start or stop being supplied to the first subcircuit, wherein the first current modulator is a ramp generator such that the bias current supplied to the first subcircuit approximates a ramp function in time following the first switch input indicating that the bias current is to start or stop being supplied to the first subcircuit.

9. An integrated circuit as described in claim 8, wherein the ramp function is specified by a selected delay from the first switch input indication, a selected rise time, and a selected maximum bias current.

10. A monolithic integrated circuit comprising:
   a substrate;
   a first set of one or more subcircuits on the substrate;
   a second set of one or mare subcircuits on the substrate; and
   a bias current supply coupled to the first and second sets to provide bias current to the first and second sets, and including:
      a first bias circuit on the substrate coupled to and to supply bias current to a first subcircuit of the first set, the first bias circuit including a first current modulator having a first switch input to control the rate of change of supplied bias current in response to the first switch input the first switch input to indicate that the bras current is to start or stop being supplied to the first subcircuit, wherein the second bias circuit includes a second current modulator having a second switch input to control the rate of change of supplied bias current in response to the second switch input, the second switch input to indicate that the bias current is to start being supplied to the second subcircuit,
   wherein the first and second subcircuits operate at mutually exclusive time periods.

11. In a monolithic integrated circuit, a method of providing bias current comprising:
   partitioning at least part of the integrated circuit into a first set of one or more sub-circuits and a second set of one or more sub-circuits, such that the first set and second set operate in mutually exclusive time periods;
   providing bias current to the first set of subcircuits, including switchably providing bias current to one or more subcircuits of the first set only for period of operation of the first set of subcircuits; and
   providing bias current to the second set of subcircuits,
   the switchably providing including controlling the rate of change of supplied bias current during the switching on or off of bias current.

12. A method as described in claim 11, wherein the integrated circuit includes an oscillator operating at a nominal frequency, and wherein controlling the rate of change of supplied bias current during the switching on or off of bias current is to limit perturbations to the oscillator nominal frequency.

13. A method as described in claim 12,
   wherein the integrated circuit is for operation as a radio transceiver including a receiver and a transmitter,
   wherein the transmitter includes the first set of subcircuits and the receiver includes the second set of subcircuits, and
   wherein the first set of subcircuits includes a power amplifier in the transmitter.

14. A method as described in claim 12, wherein switchably providing bias current to one or more subcircuits of the first set includes:
   providing a modulation function to a first programmable current generator;
   driving one or more slave programmable current generators with the output of the first current generator such that the outputs of the slave programmable current generators follow a time function defined by the modulation function; and
   biasing the one or more subcircuits with the outputs of the slave programmable current generators.

15. A method as described in claim 14, wherein modulation function is a ramp.

16. A monolithic integrated circuit comprising:
   an oscillator operating at a nominal frequency;
   a first set of one or more subcircuits;
   a second set of one or more subcircuits, the first and second sets to operate during mutually exclusive time periods; and
   a power supply coupled to, and to supply power to, the first and second sets and to the oscillator, the power supply including a first bias circuit coupled to and to supply bias current to a first subcircuit of the first set, the first bias circuit including a first current modulator having a first switch input to control the rate of change of supplied bias current in response to the first switch input, the first switch input to indicate that the bias current is to start or stop being supplied to the first subcircuit, the control of the rate of change to limit perturbations to the frequency of the oscillator during switching on and off of the first subcircuit.

17. An integrated circuit as described in claim 16, wherein the power supply further includes:

a main bias generator having an output that supplies a reference current; and wherein the first bias circuit includes:

a function generator having an output and an input terminal to accept the first switch input;

a master programmable current generator with a first input coupled to the output of the main bias generator, a control input coupled to the output of the function generator, and a current output; and a slave programmable current generator having an input coupled to the current output of the master programmable bias generator and an output coupled to the subcircuit to bias the first subcircuit.

18. A monolithic radio frequency (RF) integrated circuit comprising:

a substrate;

a first set of one or more RF subcircuits on the substrate;

a second set of one or more RF subcircuits on the substrate; and a bias current supply coupled to the first and second sets to provide bias current to the first and second sets, and including:

a first bias circuit on the substrate coupled to and to supply bias current to a first RF subcircuit of the first set, the first bias circuit including a first current modulator having a first switch input to control the rate of chance of supplied bias current in response to the first switch input, the first switch input to indicate that the bias current is to start or stop being supplied to the first RF subcircuit, wherein the integrated circuit is for operation as a radio transceiver including a receiver and a transmitter, wherein the transmitter includes the first set of RF subcircuits and the receiver includes the second set of RF subcircuits, and wherein the first RF subcircuit includes an RF power amplifier in the transmitter.

19. An integrated circuit as described in claim 18, wherein the radio transceiver is for operation in a mode having mutually exclusive transmit and receive time periods, and wherein the first switch input is to turn the power amplifier on or off for respectively operating or not operating in a transmit period.

20. An integrated circuit as described in claim 19, wherein the bias current supply further includes:

a second bias circuit on the substrate coupled to and to supply bias current to a second RF subcircuit of the second set, and a third bias circuit on the substrate coupled to and to supply bias current to a third RF subcircuit of the first set, the third bias circuit including a third current modulator having the first switch input to control the rate of change of supplied bias current in response to the first switch input, the first switch input additionally to indicate that the bias current is to start or stop being supplied to the third RF subcircuit.

21. An integrated circuit as described in claim 20, wherein the second bias circuit includes a second current modulator having a second switch input to control the rate of change of supplied bias current in response to the second switch input, the second switch input to indicate that the bias current is to start or stop being supplied to the second RF subcircuit.

22. An integrated circuit as described in claim 20, wherein the first and third bias circuits are to start supplying bias currents to the first and third RF subcircuits after different delay times from when the first switch input indicates to start supplying bias current to the first and third RF subcircuits.

23. An integrated circuit as described in claim 19, further comprising:

a first oscillator circuit on the substrate for operation at a first frequency, wherein the first current modulator is to control the rate of change of supplied bias current such that perturbations of the first frequency are reduced compared to the bias current to the first RF subcircuit being turned on or off substantially instantaneously in response to the first switch input.

24. An integrated circuit as described in claim 23, further comprising:

a second oscillator circuit on the substrate for operation at a second frequency, wherein the first current modulator is to control the rate of change of supplied bias current such that perturbations of the second frequency are reduced compared to the bias current to the first RF subcircuit being turned on or off substantially instantaneously in response to the first switch input.

25. A monolithic radio frequency (RF) integrated circuit comprising:

a substrate;

a first set of one or more RF subcircuits on the substrate;

a second set of one or more RF subcircuits on the substrate; and a bias current supply coupled to the first and second sets to provide bias current to the first and second sets, and including:

a first bias circuit on the substrate coupled to and to supply bias current to a first RF subcircuit of the first set, the first bias circuit including a first current modulator having a first switch input to control the rate of change of supplied bias current in response to the first switch input the first switch input to indicate that the bias current is to start or stop being supplied to the first RF subcircuit, wherein the first current modulator is a ramp generator such that the bias current supplied to the first RF subcircuit approximates a ramp function in time following the first switch input indicating that the bias current is to start or stop being supplied to the first RF subcircuit.

26. An integrated circuit as described in claim 25, wherein the ramp function is specified by a selected delay from the first switch input indication, a selected rise time, and a selected maximum bias current.

27. A monolithic radio frequency (RF) integrated circuit comprising:

a substrate;

a first set of one or more RF subcircuits on the substrate;

a second set of one or more RF subcircuits on the substrate; and a bias current supply coupled to the first and second sets to provide bias current to the first and second sets, and including:
a first bias circuit on the substrate coupled to and to supply bias current to a first RF subcircuit of the first set, the first bias circuit including a first current modulator having a first switch input to control the rate of change of supplied bias current in response to the first switch input the first switch input to indicate that the bias current is to start or stop being supplied to the first RF subcircuit, wherein the second bias circuit includes a second current modulator having a second switch input to control the rate of change of supplied bias current in response to the second switch input, the second switch input to indicate that the bias current is to start being supplied to the second RF subcircuit,
wherein the first and second RF subcircuits operate at mutually exclusive time periods.

28. In a monolithic radio frequency (RF) integrated circuit, a method of providing bias current comprising:
partitioning at least part of the integrated circuit into a first set of one or more RF subcircuits and a second set of one or more RF subcircuits, such that the first set and second set operate in mutually exclusive time periods;
providing bias current to the first set of RF subcircuits, including switchably providing bias current to one or more RF subcircuits of the first set only for period of operation of the first set of RF subcircuits; and
providing bias current to the second set of RF subcircuits, the switchably providing including controlling the rate of change of supplied bias current during the switching on or off of bias current,
wherein the integrated circuit includes an oscillator operating at a nominal frequency, and wherein controlling the rate of change of supplied bias current during the switching on or off of bias current is to limit perturbations to the oscillator nominal frequency.

29. A method as described in claim 28,
wherein the integrated circuit is for operation as a radio transceiver including a receiver and a transmitter,
wherein the transmitter includes the first set of RF subcircuits and the receiver includes the second set of RF subcircuits, and
wherein the first set of RF subcircuits includes a power amplifier in the transmitter.

30. A method as described in claim 28, wherein switchably providing bias current to one or more RF subcircuits of the first set includes:
providing a modulation function to a first programmable current generator;
driving one or more slave programmable current generators with the output of the first current generator such that the outputs of the slave programmable current generators follow a time function defined by the modulation function; and
biasing the one or more RF subcircuits with the outputs of the slave programmable current generators.

31. A method as described in claim 30, wherein modulation function is a ramp.

32. A monolithic radio frequency (RF) integrated circuit comprising:
an oscillator operating at a nominal frequency;
a first set of one or more RF subcircuits;
a second set of one or more RF subcircuits, the first and second sets to operate during mutually exclusive time periods; and
a power supply coupled to, and to supply power to, the first and second sets and to the oscillator, the power supply including
a first bias circuit coupled to and to supply bias current to a first RF subcircuit of the first set, the first bias circuit including a first current modulator having a first switch input to control the rate of change of supplied bias current in response to the first switch input, the first switch input to indicate that the bias current is to start or stop being supplied to the first RF subcircuit,
the control of the rate of change to limit perturbations to the frequency of the oscillator during switching on and off of the first RF subcircuit.

33. An integrated circuit as described in claim 32, wherein the power supply further includes:
a main bias generator having an output that supplies a reference current;
and wherein the first bias circuit includes:
a function generator having an output and an input terminal to accept the first switch input;
a master programmable current generator with a first input coupled to the output of the main bias generator, a control input coupled to the output of the function generator, and a current output; and
a slave programmable current generator having an input coupled to the current output of the master programmable bias generator and an output coupled to the RF subcircuit to bias the first RF subcircuit.

* * * * *

UNITED STATES PATENT AND TRADEMARK OFFICE
CERTIFICATE OF CORRECTION

PATENT NO. : 6,665,339 B1
DATED : December 16, 2003
INVENTOR(S) : Adams et al.

It is certified that error appears in the above-identified patent and that said Letters Patent is hereby corrected as shown below:

Title page,
Item [74], please change, "*Attorney, Agent, or Firm* - Doy Rosenfeld" to -- *Attorney, Agent, or Firm* - Dov Rosenfeld --.

Column 5,
Line 43, change "1n" to -- In --.

Column 15,
Line 46, change "bras" to -- bias --.
Line 61, change "mare" to -- more --.

Column 16,
Line 5, change "bras" to -- bias --.

Column 17,
Line 40, change "chance" to -- change --.

Column 19,
Line 9, change "the first switch input the first switch input" to
-- the first switch input, the first switch input --.

Signed and Sealed this

First Day of June, 2004

JON W. DUDAS
*Acting Director of the United States Patent and Trademark Office*